United States Patent [19]

Kudlich et al.

[11] 4,160,504
[45] Jul. 10, 1979

[54] PACKAGING UNIT FOR SEMICONDUCTOR DISCS

[75] Inventors: Walter Kudlich; Hans Herrmann; Günther Lechner; Kurt Berger, all of Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 870,911

[22] Filed: Jan. 19, 1978

[30] Foreign Application Priority Data

Jan. 21, 1977 [DE] Fed. Rep. of Germany ........ 2702464

[51] Int. Cl.² ..................... B65D 57/00; B65D 85/58
[52] U.S. Cl. .................................. 206/334; 206/454; 206/564
[58] Field of Search ............... 206/328, 334, 332, 454, 206/455, 456, 564, 524.8, 45.33

[56] References Cited

U.S. PATENT DOCUMENTS

| 3,467,242 | 9/1969 | De Rousse | 206/334 |
|---|---|---|---|
| 3,534,862 | 10/1970 | Shambelan | 206/332 |
| 3,923,156 | 12/1975 | Wallestad | 206/564 |
| 3,980,226 | 9/1976 | Franz | 206/524.8 |
| 4,043,451 | 8/1977 | Johnson | 206/454 |

*Primary Examiner*—William T. Dixson, Jr.

*Attorney, Agent, or Firm*—Allison C. Collard; Thomas M. Galgano

[57] ABSTRACT

A stackable, tray-type packaging unit for semiconductor discs, having a lower portion accommodating the discs and a matching lid, comprising two upright, elongated side walls in the lower portion and two narrow end walls, all walls as well as the lid consisting of deep-drawn plastic material inert to the disc material. A plurality of ribs are formed opposite to each other on the side walls, serving as guide means for the discs during the loading of the unit, stabilizing ribs for accommodating the discs are provided in the base of the lower portion on the joining line between opposite guide ribs. The lower part of the side walls are curved inwardly at an angle of 30° to 60° with respect to the perpendicular upper part. Knobs notched centrally are provided as support points for the discs in the curved part of the side walls, two opposite knobs holding the discs upright after loading and during movement, said lid being designed to hold the discs at their outer periphery in two parallel rows of inwardly-directed retention cones formed in its base and to close the lower portion by means of a snap closure. The lower portion has upright legs projecting beyond the base, and the lid has cavities matching the shape of the legs for receiving them and forming thereby a stackable unit. A gas tight envelop bag may be used after loading for better protection of the discs.

12 Claims, 10 Drawing Figures

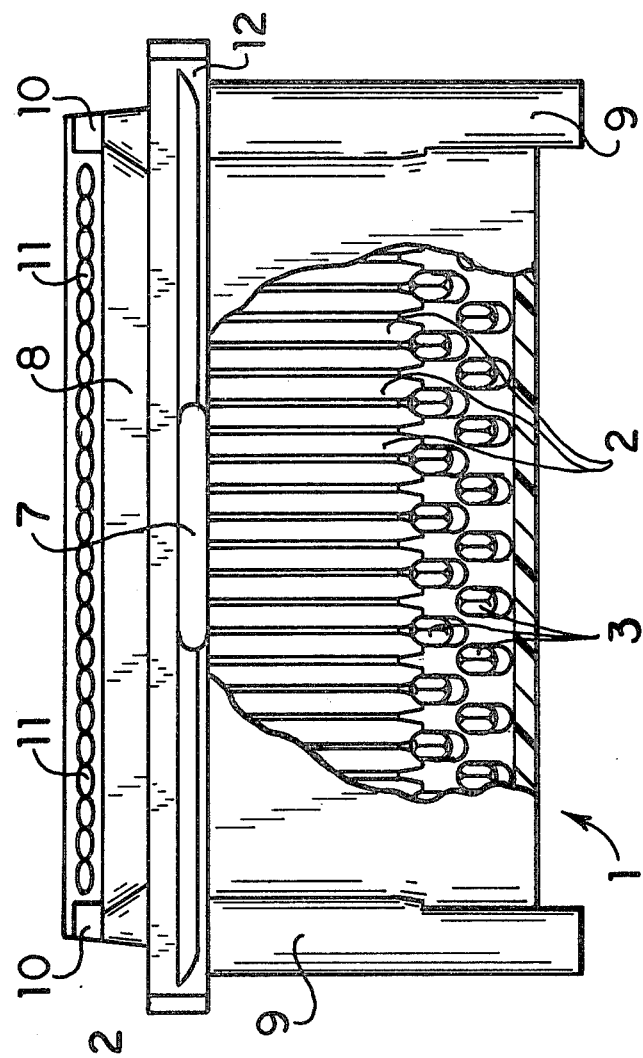
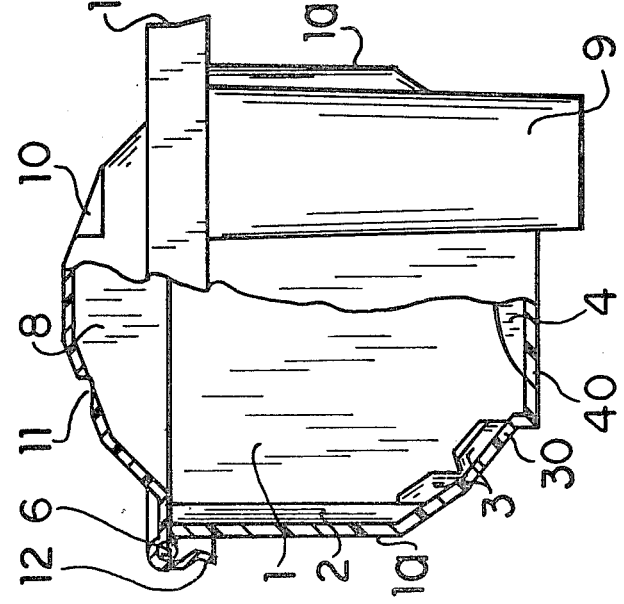

PACKAGING UNIT FOR SEMICONDUCTOR DISCS

The invention relates to a stackable, tray-type packaging unit for semiconductor discs, having a lower portion accommodating the discs and a matching lid, and after being loaded, optionally enveloped by a gastight bag of protective film.

When packaging semiconductor discs, the retention of the high degree of purity of the discs and the undamaged condition of the surface of the discs should be absolutely guaranteed. The brittle discs are not only extremely sensitive to mechanical stress of any kind, but are also sensitive to being soiled by the packaging material. In addition, the semiconductor discs must be protected against external influences, such as dust or humidity. The packaging should, in addition, be space saving and light-weight, so as to minimize its production costs and the transportation costs of the discs.

In the case of known tray-type packaging units, the semiconductor discs stand in elongated boxes having guide ribs provided in the bases and side walls, and the discs are pushed in from above. With these rigid packaging units produced by injection molding, external vibration or shock frequently results in particles being broken away from the edges of the discs and these particles can, in addition, cause scratches in the disc surfaces of the entire batch of discs.

The object of the invention was therefore to find a packaging unit that avoids the disadvantages of known packaging units and meets all the requirements of such units. This object is accomplished by a stackable, tray-type packaging unit, later to be enveloped by a gastight bag of protective film, the unit comprising opposite guide ribs formed on the two upright, elongated, longitudinal side walls of a lower portion, which consists of a deep-drawn plastics material inert with respect to the semiconductor discs to be packaged, the internal height of this portion amounting to 70 to 80% of the disc diameter, and further stabilizing ribs with rounded upper edges provided in the base of the lower portion on the joining line between two opposite guide ribs. It is a further feature that the lower 20 to 40% of the two longitudinal side walls are bent or curved inwardly at an angle of 30 to 60% with respect to the perpendicular upper part. In these transition areas, knobs notched in the middle are provided as support points for the semiconductor discs in such a number that each semiconductor disc stands upright on just two opposite knobs.

The two support points in the knobs include with the center point of the disc an angle of 75° to 115°. The packaging unit also comprises a lid which consists of a deep-drawn plastic material, inert with respect to the semiconductor discs to be packaged, and matches in the shape of a polygon the periphery of the disc. The tray is closed by means of a snap closure, having two parallel, longitudinal rows of adjacent retention cones at the base surface, which are directed into the inside of the packaging units. Between every two cones of each row, a semiconductor disc is held at its outer edge, so that the support points of the one row of cones and the support points of the parallel row of cones form an angle of 30 to 50% with the center point of the particular semiconductor disc held. In the lower portion, upright legs project beyond the base of the tray and cavities matching the shape of the upright legs are provided in the lid.

Suitable plastic materials for the production of the packaging units are generally thermoplastic materials, i.e., strong, non-homogeneously crosslinked, predominantly linear high polymers, which, at relatively high temperatures, are reversibly soft and shapeable and which do not contain any additives that migrate from the material, causing an impairment in the quality of the packaged discs. Examples are polyolefins, polyamides, linear polyesters and polyurethanes, polystyrene and, in particular, polyvinyl chloride.

Advantageously, the tray, e.g., the lower portion is prepared from a preferably transparent film, which is approximately 0.6 to 1.2 mm thick, in order to ensure the necessary stability toward external forces, whereas a comparatively thinner, preferably also transparent film, approximately 0.15 to 0.3 mm thick, is suitable for the lid, so that the film can bear against the contours of the discs at the support points under external pressure, and the discs are held fast by the action of this external force.

The pressure of the packaging unit against the semiconductor discs in this case can be the external air pressure acting on the evacuated protective bag of film and/or the tension of a shrunk film enveloping the tray-type package.

Other objects and features of the present invention will become apparent from the following detailed description when taken in connection with the accompanying drawings which disclose a single embodiment of the invention. It is to be understood that the drawings are designed for the purposes of illustration only, and are not intended as a definition of the limits and scope of the invention disclosed.

In the drawings, wherein similar reference numerals denote similar elements throughout the several views:

FIG. 1 is a longitudinal side view of the packaging unit, including the lid, the side wall of the lower portion being removed;

FIG. 2 is an end view of the unit at the right-hand side of the drawing, and a section at the left-hand side;

FIGS. 1 and 2 show the unit on an enlarged scale, while FIGS. 3 to 10 are on a yet larger scale, compared with FIGS. 1 and 2.

Figure 3:
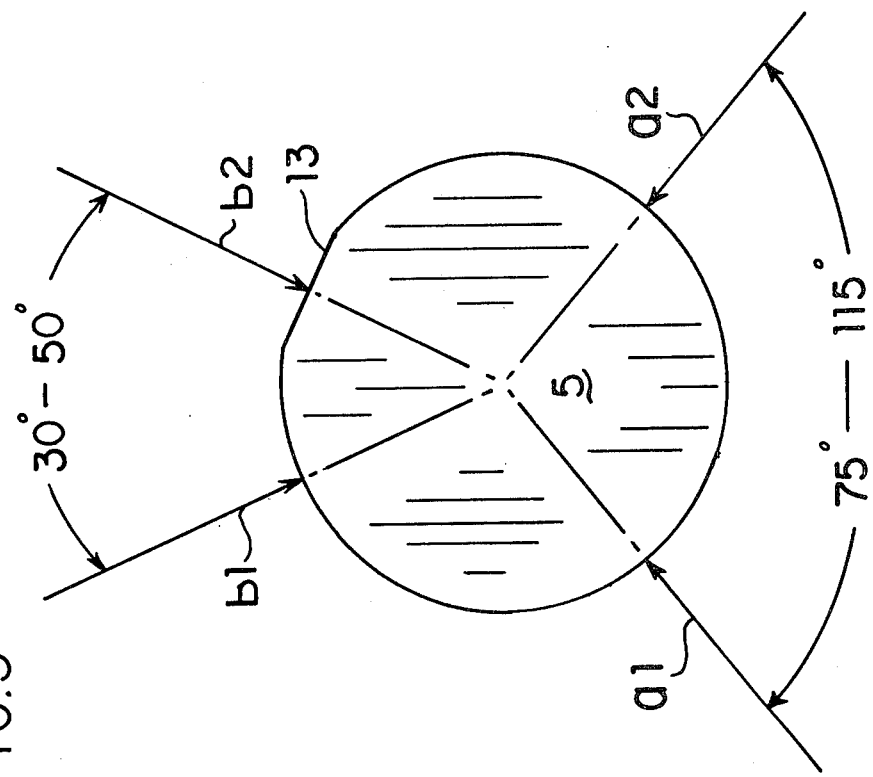
FIG. 3 shows schematically the arrangement of the support points for the packed semiconductor disc.

Referring now to the drawings, FIGS. 1 and 2 show a packaging unit according to the invention, having a lower portion 1 and a lid 8, capable of accommodating 25 semiconductor discs. Of course, the unit can be so designed that even 50 or 100, or any practical number can be stacked and delivered in one tray.

In the perpendicular portion of the longitudinally-extending side walls 1a, lateral guide ribs 2 are formed, which serve for receiving semiconductor discs between opposite pairs and guiding them during loading. The perpendicular walls 1a merge toward the bottom or base 40 with a curved, transition portion 30, where they abut on disc supporting knobs 3. To save space, knobs 3 are in staggered arrangement.

Even in the case of narrow tolerances in the guide ribs 2, a proper engagement of discs and knobs is guaranteed in particular by stabilizing ribs 4 arranged in base 40 in the connecting line between two opposite guide ribs 2. Ribs 4 stabilize the discs introduced shortly before they come to rest, to such an extent in the direction of the support points on the knobs 3, that slipping of the discs in the middle of the preferably-notched, supporting knobs is no longer possible. The support points $a_1$, $a_2$ on the two knobs 3, on which a semiconductor disc 5 stands at the base, form an angle of approximately 75° to 115°, with the center point of the disc, while the additional two support points $b_1$ and $b_2$ in the lid 8 of the unit, form an angle of 30° to 50° with the center point of the disc, as shown in FIG. 3.

Figure 4:
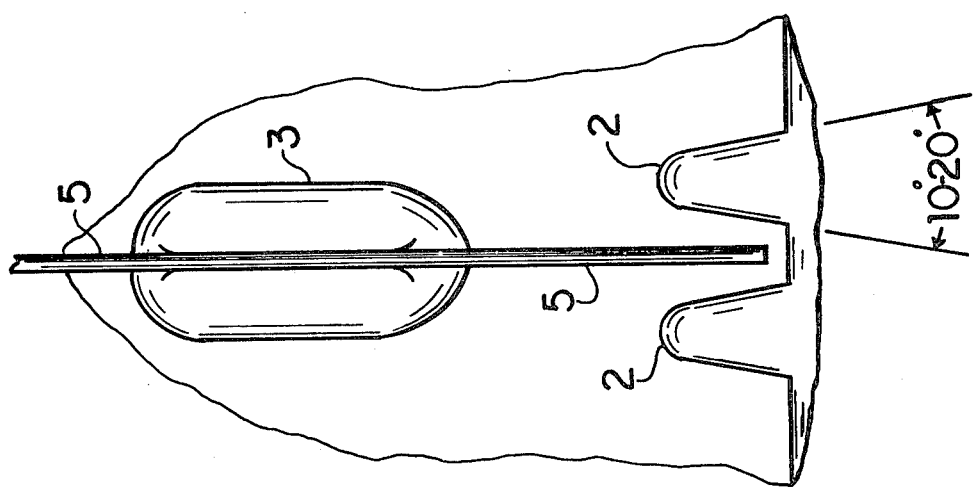
FIG. 4 shows in detail a disc between guide ribs on a supporting knob.

The longitudinal section of stabilizing ribs 4, which are arranged in base 40 of the packaging unit and are advantageously rounded at their upper edges, is preferably semi-circular, whereas their cross-section broadens downward in the shape of a wedge at an aperture angle of preferably 10° to 20°, so as to render possible the desired guidance of the semiconductor disc onto the support points. Stabilizing ribs 4 are of such a steep design that discs 5 can be guided by the rib without applying force and thus without being scratched. Without stabilization, scratching would occur at the support points under the action of force. As soon as the disc is in the correct position on supporting knobs 3, it no longer touches guide ribs 2 and stabilizing ribs 4, as can be seen in FIG. 4.

Figure 5:
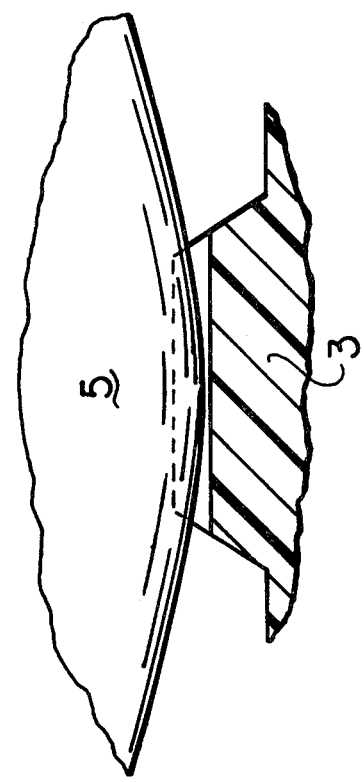
FIGS. 5 and 6 show the mounting of a disc on the supporting knob.
Figure 6:
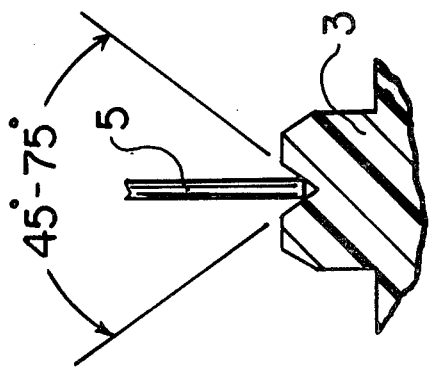

FIGS. 5 and 6 show the mounting of semiconductor disc 5 in notched supporting knobs 3. Knobs 3 have wedge-shaped notches having an aperture angle of 45° to 75°. Due to the manufacturing process, knobs 3 are not solid but as a result of the deep-drawing process, the film is stretched in these areas and is consequently slightly thinner. An excellent resilient action is thus additionally achieved in supporting knobs 3. This resilient effect is further enhanced by the staggered arrangement of the knobs, so that it is possible to accommodate tolerances of the disc diameters. These support points are obviously not points in the mathematical sense, but short stretches of approximately 1 to 2 mm along the outer periphery of the disc.

Figure 7:
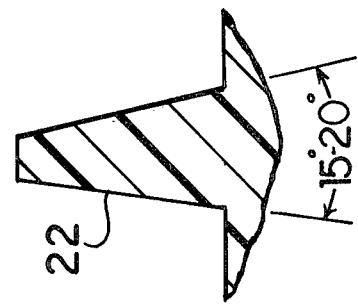
FIG. 7 is a detailed showing of a lateral guide rib.
Figure 10:
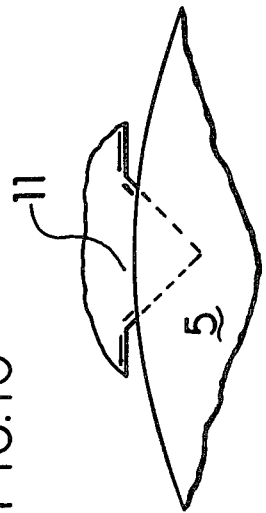
FIGS. 8, 9 and 10 are several detailed views of members in the lid for holding a disc in place.

A slightly modified embodiment of guide ribs 2 is shown in cross-section in FIG. 7, where they are designated by 22. They are in the shape of a truncated cone with an aperture angle of approximately 15° to 20° at a height of approximately 1.5 to 5 mm. The likewise truncated cone-shaped intermediate space, which is, in each case, limited by two adjacent guide ribs 22, is at the narrowest area, preferably approximately 10 to 20% wider than the semiconductor disc to be received.

In the dividing plane of the packaging unit, i.e., at the upper edge of the lower portion, a projecting margin 6 widens that portion, so that the snap closure 7 of lid 8 can easily snap in and be released again without difficulty while it is also insuring that the container is kept closed by pretensioning.

The four upright legs 9 are joined to the two narrow sides or end faces of lower portion 1. However, the two legs 9 of each narrow side may alternatively be joined into a single leg of correspondingly greater width; if desired, they may be arranged instead on the longer sides. In any case, legs 9 project slightly beyond the base of the lower portion 1, so that they form a means for stacking the packaging units. The counterpart to these feet is provided in lid 8 in the form of cavities or indentations 10. Legs 9 of a second unit can thus, when stacked, lock into the matching cavity 10 in lid 8 of the unit below, so that the complete pile is given a corresponding cohesion. As a result of the considerable width of upright legs 9, of which the two outer-most support points correspond to at least the internal width of the packaging unit, excellent resistance to tipping is achieved. This feature is enhanced by the fact that the tray itself, due to the round discs to be held, naturally has only a relatively narrow base. Upright legs 9 advantageously extend at the narrow sides as far as the dividing plane between lower portion 1 and lid 8, as a result of which a reinforcement of the lateral faces is achieved and consequently, lateral forces can be absorbed more easily.

Figure 8:
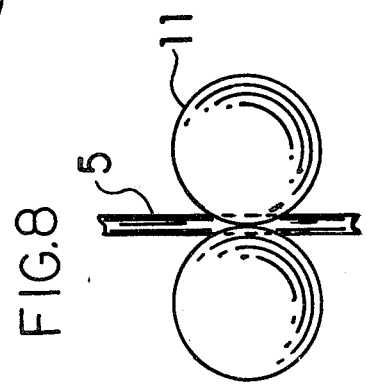
Figure 9:
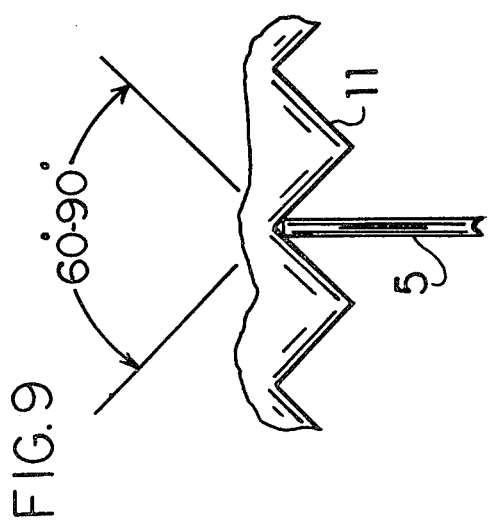

The cross-section of lid 8 is adapted, in the shape of a polygon, to the periphery of the disc. Arranged on two faces of the polygon are two parallel, longitudinal rows of retention cones 11, having adjacent bases, said cones being directed into the inside of the packaging unit (see FIG. 8). The diameter of the base surface of cones 11 corresponds to the disc spacing in the package. The apex angle of cones 11 is advantageously 60° to 90°. The discs are held at the outer periphery by two adjacent retention cones 11 in each of the two rows, as shown in FIGS. 8 and 9, the support points $b_1$ of the one row of cones and the support points $b_2$ of the parallel row of cones forming with the center point of the particular semiconductor disc 5 held an angle of 30° to 50°, corresponding to FIG. 3. These support points are in the strict sense, obviously a short line contact of approximately 0.5 to 1.5 mm length.

As a result of the higher resilient effect in this area, a good fit of lid 8 to the tolerances of the disc diameters is guaranteed. In the dividing plane, lid 8 is designed to correspond to lower portion 1, with a projecting margin 12 and a snap closure 7, in the form of an inwardly-curved beading provided in the two longitudinal sides of projecting margin 12. The snap closures 7 produces locking pressures that are adequate for transport within the works, without the use of a protective bag of film.

As a result of the design of the packaging unit, a specific four-point support for discs 5 is achieved both in the lower portion 1 and in lid 8. If the semiconductor discs 5 are ground on one side at the outer periphery, to distinguish their crystallographic orientations, then disc 5, when this so-called orientation flat 13 comes to rest above a support point, still rests on at least three support points. If the package is twisted, then as a result of the point support given, it is not possible for relative movement to occur between the disc and the encasing material.

After having been filled with the semiconductor discs, the package is introduced into a bag of protective film having as low a permeability to gas, air and water vapor as possible, and, after evacuation to, for example, approximately 20 to 200 torr, the bag is hermetically sealed. Consequently, the pressure acting on the evacuated film bags is the difference between the pressure inside and the pressure outside the protective film. This means that not only is protection against external influences such as, for example, dust and moisture, achieved, but in addition, the holding forces necessary for holding together the two-part packaging unit are achieved. Furthermore, the swelling or destruction of the bag of protective film during transport in aircraft with only partial pressure equalization in the freight cabins is consequently avoided.

The smaller pressure of the packaging unit on the semiconductor discs in the support points in the case of reduced external air pressure can be compensated by the simultaneous use of the tension of a shrinkable film. If the bag of protective film already has the properties of a shrinkable film, then after evacuating and before the final sealing of the bag of protective film, shrinking is brought about; whereas, if this is not the case, the sealed and evacuated bag of protective film is maintained in its shape by a further protective film.

The packaging unit, according to the invention, is distinguished from similar known devices by the saving in production costs, which are up to 10 times lower, due to the simple, deep-drawing process. As a result of the low price, the packaging unit can be used as a disposable unit, so that the problem of returning empties after delivery is no longer present. Since the discs are stored precisely and uniformly so as to withstand any impact, wear of the package as a result of mechanical stress, does not occur. If the package drops, it never makes contact on a disc support point, due to its design. Owing to this insensitivity to impact, the quality of the discs do not suffer, nor does breakage occur.

While only a single embodiment of the present invention has been shown and described, it will be obvious to those persons of ordinary skill in the art, that many changes and modifications may be made thereunto without departing from the spirit and scope of the invention.

What is claimed is:

1. A stackable, tray-type packaging unit for securing semiconductor discs, comprising:
    a lower housing portion for receipt of the discs having a base, two generally upright, elongated, longitudinally-extending, spaced-apart sidewalls joined to said base and two generally-upright, laterally-extending end walls joined to said base and to said sidewalls along opposite ends thereof, said sidewalls having an inwardly-tapered lower end portion;
    a plurality of parallel, laterally-extending guide ribs formed opposite each other on said sidewalls, each adjacent pair of ribs on one sidewall cooperating with an oppositely-disposed pair of ribs on the other sidewall to serve as guides to facilitate the introduction of discs therebetween prior to their full receipt in said housing;
    a plurality of stabilizing ribs each of which is formed on said base on the joining line between a pair of oppositely-disposed guide ribs, formed on said sidewalls, said ribs serving to stabilize said discs during their introduction and prior to their full receipt in said housing portion;
    a plurality of centrally-notched knobs formed opposite each other on said sidewalls in said lower end portions thereof, each of said knobs on one sidewall cooperating with an oppositely-disposed knob the other sidewall to provide only two support points on which a disc may rest when fully received in said housing portion, and said knobs cooperating to maintain said discs in an upright position;
    a lid for said housing including snap-fit means for releasably securing said lid to said sidewalls and endwalls of said housing portion, said lid having an inner surface and having formed on its inner surface two parallel, longitudinally-extending rows of downwardly-directed retention cones, each adjacent pair of cones in one row of which cooperate with an adjacent pair of cones in the other row to provide a maximum of two support points which engage and support the outer periphery of a single disc, said cones and said knobs providing the sole support for said discs when fully received in said packaging unit with each disc being thus supported solely by a maximum of four support points provided by said knobs and cones.

2. The packaging unit as recited in claim 1, wherein said lower housing portion has upright legs joined to said endwalls and projecting below said base.

3. The packaging unit as recited in claim 1, wherein the lid has cavities matching the shape of the projecting legs, for receiving the legs in the cavities and forming a stackable unit.

4. The packaging unit as recited in claim 1, wherein the internal height of the lower housing portion amounts to 70 to 80% of the disc diameter.

5. The packaging unit as recited in claim 1, wherein the stabilizing ribs have rounded upper edges, provided in the base of the lower housing portion on the joining line between two opposite guide ribs.

6. The packaging unit as recited in claim 1, wherein each of opposite pairs of knobs have support points in the knobs for contact with the discs, said points being separated by an angle of 75° to 115°.

7. The packaging unit as recited in claim 1, wherein said lid is the shape of a polygon, matching the periphery of the disc.

8. The packaging unit as recited in claim 1, wherein the support points of the one row of lid cones and the support points of the parallel row of lid cones are separated by an angle of 30° to 50° with respect to each other.

9. The packaging unit as recited in claim 1, wherein all walls and said lid are constructed of deep-drawn plastic material which is inert to the disc material.

10. The packaging unit as recited in claim 1, additionally comprising a bag constructed of protective film, having a low permeability to gas, air and water, said bag being inserted over said packaging unit, and means for evacuating and sealing said bag to the unit.

11. The packaging unit as recited in claim 1, wherein said sidewalls having an upper portion disposed perpendicularly with respect to said base and said lower portions thereof amount to 20 to 40% of the total height of said sidewalls and curves inwardly at an angle of 30° to 60° with respect to said upper portion.

12. The packaging unit according to claim 1, wherein said knobs and said cones are fabricated from a resilient material.

* * * * *